United States Patent [19]
MacArthur et al.

[11] Patent Number: 5,925,920
[45] Date of Patent: *Jul. 20, 1999

[54] TECHNIQUES AND CIRCUITS FOR HIGH YIELD IMPROVEMENTS IN PROGRAMMABLE DEVICES USING REDUNDANT ROUTING RESOURCES

[75] Inventors: James MacArthur, Santa Clara; Timothy M. Lacey, Cupertino, both of Calif.

[73] Assignee: QuickLogic Corporation, Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/662,056

[22] Filed: Jun. 12, 1996

[51] Int. Cl.$^6$ .................................................. H03K 19/177
[52] U.S. Cl. ................... 257/530; 257/209; 340/825.84; 337/293; 326/10; 326/13; 326/39
[58] Field of Search .................................... 257/529, 530, 257/209, 919, 665; 327/525; 340/825.84; 326/10, 13, 38, 39; 438/600, 601; 337/293

[56] References Cited

U.S. PATENT DOCUMENTS

| | | | |
|---|---|---|---|
| 4,974,048 | 11/1990 | Chakravorty et al. | 257/530 |
| 5,011,791 | 4/1991 | Mastroianni | 438/601 |
| 5,087,958 | 2/1992 | Chen et al. | 257/530 |
| 5,200,652 | 4/1993 | Lee | 326/10 |
| 5,293,133 | 3/1994 | Birkner et al. | 257/530 |
| 5,371,422 | 12/1994 | Patel et al. | 326/41 |
| 5,414,364 | 5/1995 | McCollum | 257/530 |
| 5,491,664 | 2/1996 | Phelan | 365/200 |
| 5,495,181 | 2/1996 | Kolze | 326/38 |
| 5,498,975 | 3/1996 | Cliff et al. | 326/10 |
| 5,498,979 | 3/1996 | Parlour et al. | 326/38 |
| 5,576,554 | 11/1996 | Hsu | 257/530 |
| 5,677,888 | 10/1997 | Lui et al. | 365/225.7 |

FOREIGN PATENT DOCUMENTS

| | | | |
|---|---|---|---|
| 1-158764 | 6/1989 | Japan | 257/529 |

OTHER PUBLICATIONS

MacArthur, James B., Lacey, Timothy M.: U. S. Patent Application entitled "Techniques and Circuits for High Yield Improvements in Programmable Devices Using Redundant Logic," mailed Jun. 12, 1996, Express Mail No. TB907643759US.

MacArthur, James B., Lacey, Timothy M.: U.S. Patent Application entitled "Techniques and Circuits for High Yield Improvements in Programmable Devices Using Redundant Logic" filed Jun. 12, 1996; Application No.: 08/662,054.

*Primary Examiner*—John Guay
*Attorney, Agent, or Firm*—Skjerven, Morrill, MacPherson, Franklin & Friel LLP

[57] ABSTRACT

The present invention provides a method and apparatus for high yield improvements in programmable logic devices using redundancy. The present invention concerns a programmable logic device comprising a plurality of routings lines coupled to a plurality of logic blocks when programmed. During programming, a path is routed through the routing lines by programming the selected programmable elements. The selected programmable elements are located at each interconnect point between at least two routing lines or two segments of a routing lines along the path. The programmable elements include at least two interconnect circuits coupled in parallel. The programmable element is successfully programmed when at least one of the interconnect circuits is functional after programming.

15 Claims, 3 Drawing Sheets

TECHNIQUES AND CIRCUITS FOR HIGH YIELD IMPROVEMENTS IN PROGRAMMABLE DEVICES USING REDUNDANT ROUTING RESOURCES

FIELD OF THE INVENTION

The present invention relates generally to the field of integrated circuits. More particularly, the present invention relates to the field of programmable logic devices.

BACKGROUND OF THE INVENTION

Programmable logic devices (PLDs), sometimes referred to as PALs, PLAs, FPLAs, PLDs, FPLDs, EEPLDs, LCAs and FPGAs, allow the user to electrically program standard, off-the-shelf integrated circuit logic devices to meet the specific needs of their particular application. Thus, proprietary and standard logic functions can be designed and fabricated in-house by using programmable logic devices without the long engineering lead times, the high tooling costs, and the complex procurement and inventory issues associated with application specific integrated circuits (ASIC) devices.

Such programmable logic devices include a plurality of user-configurable logic blocks that are interconnected via an interconnect structure. The plurality of user-configurable logic blocks, often referred to as macrocells, are typically arranged in an array or matrix structure. By interconnecting the user-configurable logic blocks via the interconnect structure, the programmable logic device can be programmed to perform complex logic functions.

Interconnect structures having a plurality of horizontal and vertical routing lines are typically arranged in a grid-like structure. The routing lines are metal lines or wires (or other conductive materials) that carry signals to and from the used logic blocks. Located at every or almost every interconnect point of a horizontal routing line and a vertical routing line is a programmable element that creates a cross-link when programmed and located at every or almost every interconnect point of two horizontal routing lines or two vertical routing lines is a programmable element that creates a pass-link when programmed. The cross-link is used to either couple or decouple the horizontal and vertical routing lines at an interconnect point while the pass-link is used to either couple or decouple two segments of a routing line. The programmable elements may be fuses or antifuses which can be programmed to respectively connect or disconnect the routing lines at the interconnect point. It is appreciated that other types of programmable elements may be used as well such as Static Random Access Memories (SRAMs) and flash Electrically Erasable Programmable Read-Only Memories (EEPROMs). It is also appreciated that the various programmable elements may be used in various parts of a PLD such as the macrocells, product term matrix, and the "OR" term array.

A fuse is a device having two electrodes and a conductive element which electrically connects the two electrodes. When a fuse (of one embodiment) is programmed, by passage of sufficient current between its electrodes, the two electrodes are electrically disconnected. Laser fuses are programmed by using a laser to disconnect the electrodes. By contrast, an antifuse is a device having two electrodes which are not electrically connected when unprogrammed. However, when programmed, the first and second electrodes of the antifuse are permanently electrically connected. An antifuse (of one embodiment) is programmed by applying sufficient voltage ("programming voltage") between its first and second electrodes, thereby forming a bi-directional conductive link between the first and the second electrodes.

In order to program a programmable logic device, the user inputs a logic circuit design into a computer using one of a variety of design entry options. Possible design entry options include hierarchical schematic capture, a hardware description language, Boolean equations, state machine diagrams, truth table, netlist, and microcoded assembly language. After the logic circuit design is entered into the computer, the computer maps the logic circuit design into the programmable logic device in order to implement the logic circuit design when programmed. During programming, a path is routed through the interconnect structure by selectively programming the programmable elements at each interconnect point of two routing lines or two segments of a routing line in the path. In other words, the logic blocks selected for programming are coupled to the interconnect structure during routing such that the appropriate voltage signals can be applied to the input/output ports of each selected logic block.

During the manufacturing and testing of a programmable logic device, the device may be found to have a defective programmable element. If the programmable element is a one-time programmable device such as a fuse or antifuse, a routing failure due to the failure of a programmable element in the routing path may cause the entire programmable logic device to be defective. This type of failure often requires the user to dispose of the device. However, if alternative routing resources are available to correct such a defect, the programmable logic device is functional despite such failures. Therefore, to reduce the probability of producing defective programmable logic devices, it is desirable to provide a programmable logic device having redundant routing resources.

SUMMARY OF THE INVENTION

The present invention provides a method and apparatus for high yield improvements in programmable logic devices using redundancy. The present invention concerns a programmable logic device having a plurality of routing lines that are selectively coupled to at least one logic block in the programmable logic device. Located at the interconnect point of at least two routing lines or two segments of a routing line is a programmable element. The programmable element includes at least two interconnect circuits coupled in parallel.

The present invention also concerns a method for programming an integrated circuit. A path though a plurality of routing lines is selected in order to configure the selected logic blocks. The path is routed by programming the programmable elements located at the interconnect points along the path. At least one of the programmable elements selected for programming includes a plurality of interconnect circuits coupled in parallel. During the programming of the integrated circuit, the nonfunctional programmable elements in the path are detected such that the path is rerouted to bypass the nonfunctional programmable element.

Other features and advantages of the present invention will be apparent from the accompanying drawings and from the detailed description that follows below.

BRIEF DESCRIPTION OF THE DRAWINGS

The present invention is illustrated, by way of example and not limitation, in the figures of the accompanying drawings, in which like references indicate similar elements and in which.

DETAILED DESCRIPTION OF THE PRESENT INVENTION

The following detailed description sets forth embodiments in accordance with the present invention that use redundancy techniques to improve the yields of programmable logic devices. In the following description, details are set forth such as specific circuitry configurations in order to provide a thorough understanding of the present invention. It will be evident, however, that the present invention may be practiced other than as explicitly described in these details. In other instances, the functioning of well-known circuit components, logic gates, etc., have not been described in particular detail so as not to obscure the present invention.

The following description of the present invention concerns various methods and apparatuses for incorporating redundancy into programmable logic devices. According to one embodiment of the present invention, redundancy is implemented by providing programmable elements having multiple interconnect circuits coupled in parallel. In another embodiment, the present invention provides a technique to reroute the routing path through the interconnect structure using redundant routing resources when a defective programmable element causes a routing failure.

Figure 1:
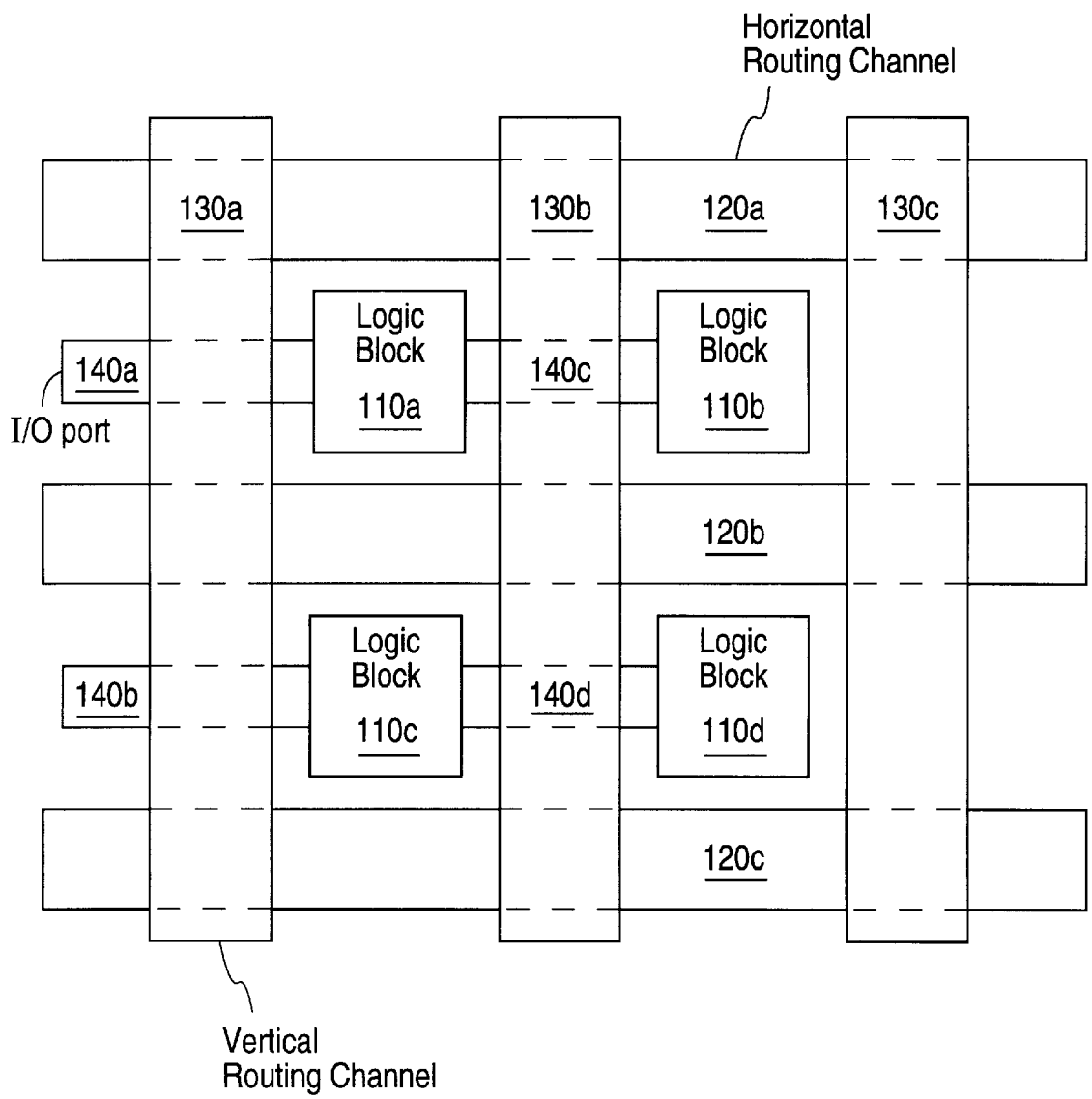
FIG. 1 is an illustration of a conventional programmable logic device.

FIG. 1 illustrates a block diagram of a typical programmable logic device 100 having logic blocks 110a–110d arranged in an array structure with horizontal routing channels 120a–120c and vertical routing channels 130a–130c forming the interconnect structure. Each horizontal routing channel 120a–120c has a plurality of horizontal routing lines and each vertical routing channel 130a–130c has a plurality of vertical routing lines. The interconnect structure is coupled to the array of logic blocks 110a–100d via input/output ports 140a–140d. The input/output ports 140a–140d may include a plurality of horizontal and/or vertical routing lines.

At one or more (preferably every or almost every) interconnect point of two routing lines or two segments of a routing line is a programmable element. An interconnect point is the intersection between (a) a horizontal and a vertical routing line, (b) two horizontal routing lines or (c) two vertical routing lines. When the programmable element at the intersection of a horizontal and a vertical routing line is programmed, a cross-link between the routing lines is formed. Likewise, when the programmable element at the intersection of two segments of a horizontal routing line or two segments of a vertical routing line is programmed, a pass-link is formed. An intersection between two routing lines may also be referred to as a node.

Figure 2A:
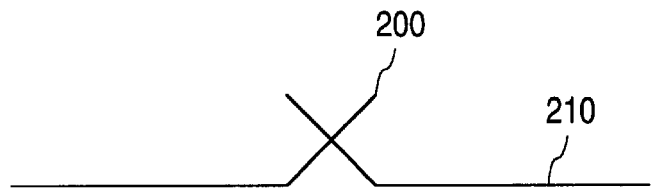
FIG. 2a is an illustration of a conventional antifuse device.

Currently, a programmable element includes a single interconnect circuit such as a fuse or an antifuse device. FIG. 2a illustrates a single antifuse device 200 coupled to routing line 210. In order to program the antifuse device 200, a high voltage Vpp is applied to one end of the routing line 210 and a low voltage or ground is applied to the other end of the routing line 210. Unfortunately, if a single antifuse device 200 unsuccessfully programs, a routing failure occurs. As a result, the entire programmable device may become useless and typically should be discarded.

Figure 2B:
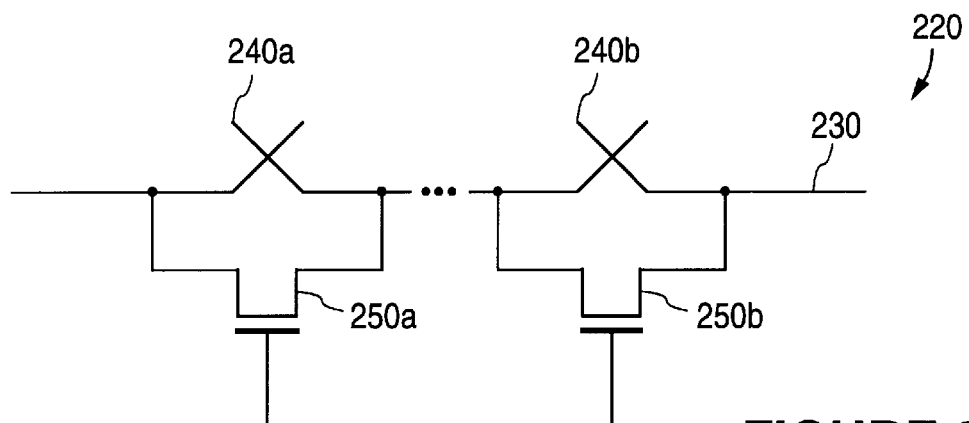
FIG. 2b is an illustration of routing line having multiple antifuse devices.

FIG. 2b illustrates a plurality of antifuse circuits coupled along a routing line 230 to form a string of antifuse circuits. Typically, each antifuse circuit in the string includes an antifuse device and a transistor such as a MOSFET (Metal-Oxide-Semiconductor Field-Effect Transistor). By coupling a transistor in parallel with an antifuse device, each antifuse circuit located along a routing line can be individually selected for programming.

Typically, antifuse device(s) along a routing line are programmed one at a time. According to FIG. 2b, a first antifuse circuit including the antifuse device 240a and the transistor 250a and a second antifuse circuit including the antifuse device 240b and the transistor 250b may be serially coupled via routing line 230. During programming, a high voltage Vpp is applied to one end of the routing line and a low voltage or ground is applied to the other end of the routing line such that each antifuse circuit selected for programming is programmed and each antifuse circuit not selected for programming is not programmed. An antifuse circuit is selected or deselected in response to the voltage applied to the gate of its transistor. For example, if a transistor 250a is an n-channel MOSFET, a high voltage applied to the gate of transistor 250a turns "on" the transistor 250a thereby deselecting the antifuse device 240a, and a low voltage applied to the gate of transistor 250a turns "off" the transistor 250a thereby selecting the antifuse 240a.

Rather than using a single antifuse device at an interconnect, one embodiment of the present invention uses N antifuse circuits coupled in parallel to create a single programmable element. By having more than one antifuse circuit coupled in parallel, the chances of underprogramming or faulty programming is reduced. In other words, as more fuses are used in parallel, the chance of all of them being unprogrammable is significantly reduced. Thus, the programming yield of the programmable logic devices is improved by using this redundancy which reduces the susceptibility of a fuse failure.

Figure 3A:
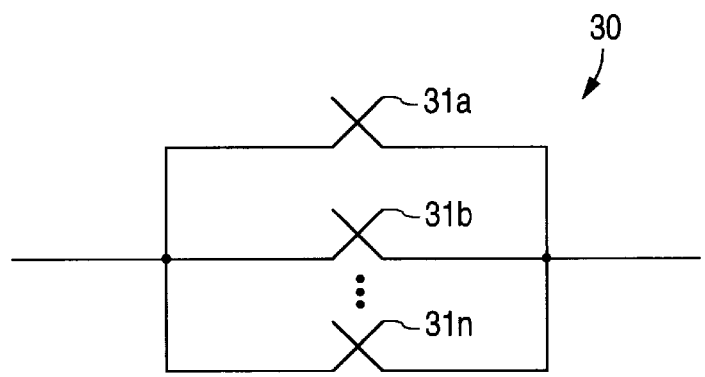
FIG. 3a is an illustration of one embodiment of the present programmable element.

FIG. 3a illustrates one embodiment of the programmable element 30 in the present invention. The programmable element 30 includes N antifuse circuits coupled in parallel. Each antifuse circuit in FIG. 3a includes one antifuse device. According to FIG. 3a, antifuse devices 31a–31n are coupled in parallel such that during programming the programming current flows through all N antifuse circuits. In the event that at least one of the N antifuse circuits is functional after programming, then the programmable element is successfully programmed.

Figure 3B:
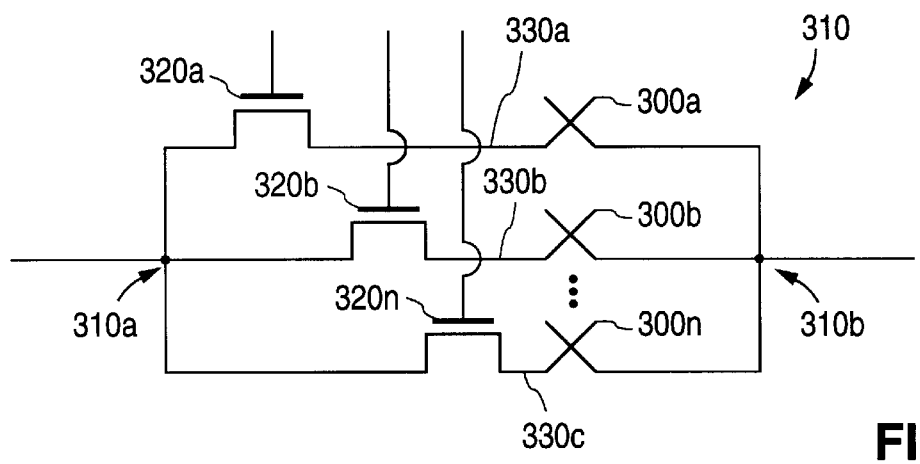
FIG. 3b is an illustration of another embodiment of the present programmable element.

FIG. 3b illustrates a further embodiment of the present programmable element 310. The programmable element 310 includes N antifuse circuits 300a–300n coupled in parallel. Each of the antifuse circuits includes an antifuse device coupled to a pass transistor via a routing line. According to FIG. 3b, the transistor 320a is coupled to the antifuse device 300a via routing line 330a, the transistor 320b is coupled to the antifuse device 300b via routing line 330b and the transistor 320c is coupled to the antifuse device 300c via routing line 330c. In one embodiment, each pass transistor is a MOSFET (Metal-Oxide-Semiconductor Field-Effect Transistor) having its drain terminal coupled to the input of the programmable element 310a and its source terminal coupled to the output of the programmable element 310b via an antifuse device.

During programming, the input terminal 310a is coupled to a programming voltage $V_{PGM}$ (for example, in the range of 7–12 volts) and the output terminal 310b is coupled to ground or a low voltage. The programmable element 310 is programmed by programming at least one of the N antifuse circuits. Each of the antifuse circuits in the programmable element can be selected for programming by applying a high voltage $V_H$ to the gate terminal of the pass transistor 320 to allow the transistor to conduct current. During programming, current flows through the pass transistor to program the antifuse device that is coupled to the pass transistor via the routing line. The high voltage $V_H$ must provide a voltage at least as high as the programming voltage $V_{PGM}$ plus the threshold voltage $V_T$ of the transistor to fully turn "on" the transistor.

In this embodiment, the user may program any number of the N antifuse devices. For example, the user may select to program one out of N antifuse devices by switching on its corresponding pass transistor or the user may select to program all N antifuse circuits by switching on the pass transistors for all N antifuse circuits either simultaneously or one at a time. In the event the user programs only one antifuse circuit in the programmable element 310, the user has the option of programming a redundant antifuse circuit in the event the originally programmed antifuse circuit fails to program. In the event the user programs more than one of the N antifuse circuits, if any of the selected antifuse circuits in the programmable element 310 is functional after programming, the programmable element 310 is successfully programmed. By providing a mechanism to correct fuse failures in this manner, the chances of having a defective programmable logic device due to a routing defect are decreased. Incorporating parallel antifuse circuits in programmable logic device may lead to significant yield improvements which is highly desirable when fabricating these devices.

It may be desirable to program a larger number (i.e., more than one) of antifuse circuits in each programmable element in order to increase the overall speed of the programmable logic device. In other words, as more antifuse circuits in a programmable element are selected for programming, the resistance of each programmable element is reduced and the overall speed of the programmable logic device is increased. Therefore, the ability to select the number of antifuse circuits in each programmable element for programming provides the user with the flexibility of selecting the most desirable number of parallel antifuse circuits to be programmed.

Figure 3C:
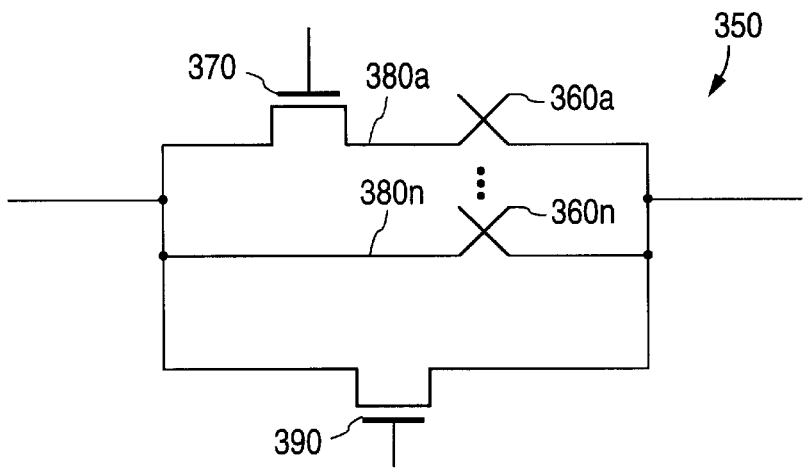
FIG. 3c is an illustration of an alternative embodiment of the present programmable element.

FIG. 3c illustrates an alternative embodiment of a programmable element having N antifuse circuits coupled in parallel. FIG. 3c illustrates that the antifuse circuits may or may not include a series pass transistor. According to FIG. 3c, one of the antifuse circuits includes a series pass transistor 370 coupled to the antifuse device 360a via the routing line 380a and another antifuse circuit includes the antifuse device 360n coupled to the routing line 380n. Thus, the antifuse circuit including the pass transistor 370 may be selected or deselected for programming and the antifuse circuit without the pass transistor 370 is always selected for programming. The N antifuse circuits in the programmable element 350 are coupled in parallel with the transistor 390. When a high voltage is applied to the gate of the transistor 390 to allow sufficient current to flow through the transistor 390 to turn it "on", the programmable element 350 is deselected and left unprogrammed. On the other hand, when a low voltage is applied to the gate of the transistor 390, the transistor 390 is turned "off" and the programmable element is selected, thereby allowing a programming current to flow through the selected antifuse circuit for programming.

Figure 4:
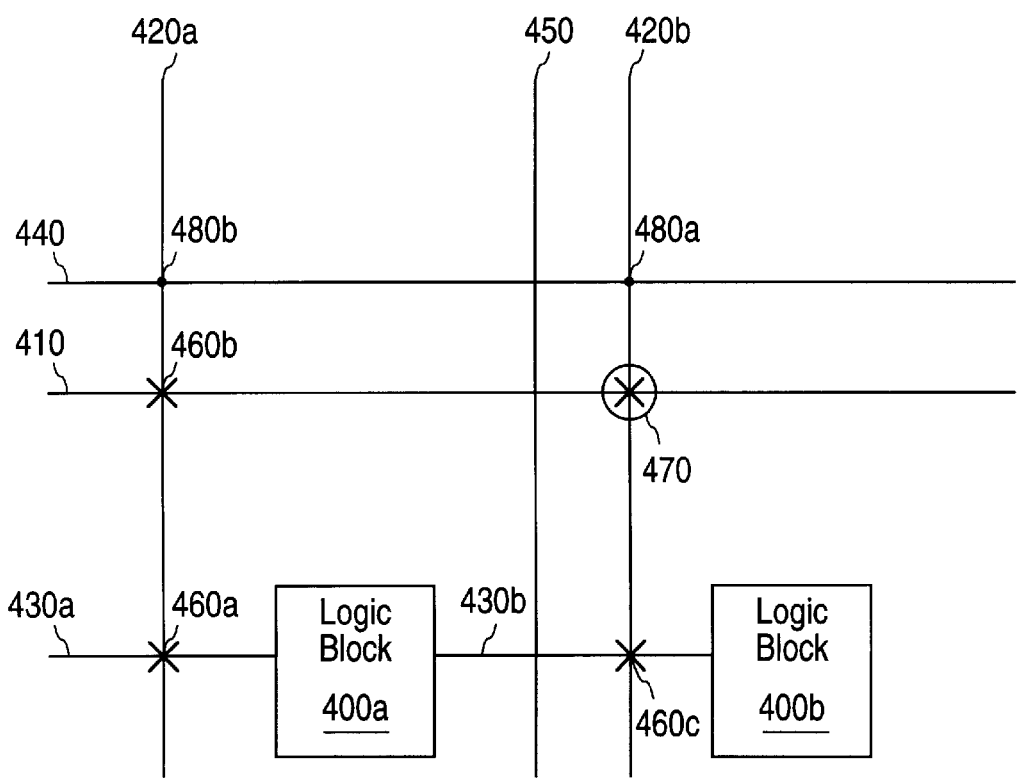
FIG. 4 illustrates a portion of a programmable logic device that has been rerouted.

FIG. 4 illustrates an embodiment of the present invention that provides an alternative routing path for a programmable element that has failed during programming. A simple illustrative logic array and interconnect structure is shown in the programmable logic device in FIG. 4. According to FIG. 4, logic blocks 400a and 400b represent the logic array (which may include additional rows and/or columns of logic blocks) and the horizontal routing lines 410, 430a and 430b, the redundant horizontal routing line 440, the vertical routing lines 420a and 420b, and the redundant vertical routing line 450 represent the interconnect structure (which may include additional horizontal, redundant horizontal, vertical and/or redundant vertical routing lines).

As previously mentioned, a programmable element may be located at the interconnect point of two routing lines. In one embodiment of the present invention, each programmable element may have multiple interconnect circuits coupled in parallel, as described above. During programming, the selected programmable elements located at the interconnect point of two routing lines or two segments of a routing line in the routing path are programmed to form either a cross-link or a pass-link. In the event a routing failure occurs at an interconnect point due to a programmable element failure, the programmable logic device may become useless, unless the original routing path is rerouted around the programmable element failure. In the present invention, rerouting can be performed if there are unused alternative or redundant routing lines to provide an alternative routing path to bypass the programmable element failure.

By coupling the selected logic blocks to the interconnect structure during programming, the appropriate voltage signals can be applied to the selected inputs of the selected logic blocks to configure the selected logic blocks. When the selected logic blocks are configured and coupled together via the interconnect structure, the programmable logic device is programmed to perform the complex logic function specified by the user.

FIG. 4 illustrates a routing path through the interconnect structure that is rerouted to bypass a programmable element failure. According to FIG. 4, the programmable elements at 460a, 460b, 460c and 470 are programmed to form the original routing path for coupling logic blocks 400a and 400b to the interconnect structure. Assuming that the programmable element 470 fails to program properly (i.e. unable to provide a conductive path between the routing lines 410 and 420b), then a new path is rerouted around the failed programmable element 470 by programming the programmable elements 480a and 480b to use the previously unused or redundant horizontal routing resource 440. Thus, the newly rerouted path uses the redundant routing lines 440 to couple the logic block 400b to the interconnect structure. Similarly, the redundant vertical routing line 450 could be used to fix the defective programmable element 470. For example, the programmable elements located at the intersection of the vertical routing line 450 and the horizontal routing lines 410 and 430b can be programmed to bypass the failed programmable element 470.

The programming aspect of the present invention may be conveniently implemented using a conventional general purpose digital computer programmed according to the teachings of the present specification, as will be apparent to those skilled in the relevant art(s). Appropriate software coding can readily be prepared by skilled programmers based on the teachings of the present disclosure, as will be apparent to those skilled in the relevant art(s).

The present invention may also be implemented by the preparation of application specific integrated circuits or by interconnecting an appropriate network of conventional component circuits as described herein, modifications of which will be readily apparent to those skilled in the relevant art(s).

The present invention thus also includes a computer program product which may comprise a storage medium including instructions which can be used to program a computer to perform a process according to the present invention. The storage medium can include, but is not limited to, any type of disk including floppy disks, optical disks, CD-ROMs, and magneto-optical disks, ROMs, RAMs, EPROMS, EEPROMs, magnet or optical cards, or any type of media suitable for storing electronic instructions.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regard in an illustrative rather than a restrictive sense.

I claim:

1. A programmable logic device, comprising:
    a plurality of logic blocks;
    a plurality of signal routing lines connecting said logic blocks;
    at least one programmable element located at an interconnect point of at least two of said signal routing lines or two segments of one of said signal routing lines, at least one of said programmable elements comprising at least two parallel interconnect circuits each of said interconnect circuits being individually selectable.

2. The programmable logic device of claim 1, wherein at least one of said programmable elements further comprises a select circuit coupled to each of said interconnect circuits, said select circuit being capable of selecting or deselecting one of said programmable elements for programming.

3. The programmable logic device of claim 2, wherein said select circuit comprises a transistor having first and second terminals respectively coupled to first and second ends of at least one of said parallel interconnect circuits, and a third terminal capable of receiving a voltage signal to select or deselect one of said programmable elements for programming.

4. The programmable logic device of claim 2, wherein each said interconnect circuits each have a first end coupled to a first voltage terminal and a second end coupled to a second voltage terminal such that a programming current is capable of flowing through at least one of said interconnect circuits.

5. The programmable logic device of claim 1, wherein each of said interconnect circuits comprises a switch and an antifuse device.

6. The programmable logic device of claim 5, wherein said switch comprises a transistor having a first terminal coupled to a first end of said programmable element, a second terminal coupled to said antifuse device, and a third terminal capable of receiving a programming voltage signal.

7. The programmable logic device of claim 1, wherein each of said interconnect circuits comprises an antifuse device.

8. The programmable logic device of claim 1, wherein said parallel interconnect circuits comprise a first interconnect circuit and a second interconnect circuit, wherein said first interconnect circuit comprises a first antifuse device and said second interconnect circuit comprises a switch and a second antifuse device such that a said second interconnect circuit is capable of being selected or deselected for programming.

9. The programmable logic device of claim 1, wherein said at least one of said programmable elements creates a cross-link or a pass-link when programmed, wherein said cross-link is a connection between a horizontal signal routing line and a vertical signal routing line and said pass-link is a connection between two segments of said horizontal signal routing line or said vertical signal routing line.

10. A programmable logic device having a programmable interconnect structure with a plurality of signal routing nodes, said programmable logic device comprising:
    a first fuse circuit located at least one of said signal routing nodes; and
    a second fuse circuit located at the same signal routing node(s) as said first fuse circuit, said second fuse circuit being optionally selectable by a select circuit coupled thereto, wherein said first and said second fuse circuits are coupled in parallel and are individually selectable from one another.

11. The integrated circuit of claim 10, wherein each of said first and said second fuse circuits has a first end coupled to a first voltage terminal and a second end coupled to a second voltage terminal during programming.

12. The integrated circuit of claim 10, wherein said programmable interconnect structure includes a plurality of routing lines, and each node couples at least two of said routing lines or two segments of one of said routing lines when programmed.

13. The integrated circuit of claim 10, wherein each of said first and said second fuse circuits comprises an antifuse device.

14. The integrated circuit of claim 13, wherein at least one of said first and said second fuse circuits further comprises a switch.

15. The integrated circuit of claim 14, wherein said switch comprises a transistor having a first terminal coupled to a first end of said fuse circuit, a second terminal coupled to said antifuse device, and a third terminal capable of receiving a programming voltage signal capable of turning said transistor "on" or "off".

* * * * *